(12) United States Patent
Baumgartner et al.

(10) Patent No.: US 8,413,091 B2
(45) Date of Patent: Apr. 2, 2013

(54) ENHANCING REDUNDANCY REMOVAL WITH EARLY MERGING

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/092,304

(22) Filed: Apr. 22, 2011

(65) Prior Publication Data

US 2012/0272197 A1 Oct. 25, 2012

(51) Int. Cl.
*G06F 17/50* (2006.01)
(52) U.S. Cl. ........ 716/107; 716/103; 716/106; 716/110; 716/112; 716/132
(58) Field of Classification Search .................. 716/103, 716/106–107, 110–112, 132
See application file for complete search history.

(56) References Cited

U.S. PATENT DOCUMENTS

| | | | |
|---|---|---|---|
| 7,383,166 | B2 | 6/2008 | Ashar et al. |
| 2003/0225552 | A1 | 12/2003 | Ganai et al. |
| 2004/0019468 | A1 | 1/2004 | De Moura et al. |
| 2004/0230407 | A1 | 11/2004 | Gupta et al. |
| 2006/0085782 | A1 | 4/2006 | Ward |
| 2007/0226666 | A1 | 9/2007 | Ganai et al. |
| 2009/0007038 | A1 | 1/2009 | Wang et al. |
| 2009/0100385 | A1* | 4/2009 | Baumgartner et al. ........... 716/2 |
| 2009/0300559 | A1 | 12/2009 | Baumgartner et al. |
| 2010/0223584 | A1 | 9/2010 | Baumgartner et al. |

FOREIGN PATENT DOCUMENTS

| | | |
|---|---|---|
| DE | 10243598 A1 | 4/2003 |
| EP | 1515251 A1 | 3/2005 |
| EP | 2084615 A1 | 8/2009 |
| JP | 2005285017 | 10/2005 |
| WO | WO2008/064185 A1 | 5/2008 |

OTHER PUBLICATIONS

USPTO U.S. Appl. No. 13/458,534.
Bjesse, Per, et al., "SAT-based Verification without State Space Traersal", Proceedings of the Third International Conference on Formal Methods in Computer-Aided Design (FMCAD'00), 2000, 18 pages.

(Continued)

*Primary Examiner* — Nghia Doan
(74) *Attorney, Agent, or Firm* — Francis Lammes; Stephen J. Walder, Jr.; Libby Z. Toub

(57) ABSTRACT

A mechanism is provided for simplifying a netlist before computational resources are exceeded. For each of a set of suspected equivalences in a proof graph of a netlist, a determination is made as to whether equivalence holds for at least one of an equivalence or an equivalence class by identifying whether the equivalence or equivalence class is either affecting or non-affecting. Responsive to the equivalence or equivalence class being affecting, a proof dependency is recorded as an edge in a proof graph. For each node in the proof graph, a determination is made as to whether the node has a falsified dependency. Responsive to the node failing to have a falsified dependency, identification is made that all dependencies are satisfied and that the equivalences represented by the node in the proof graph are sequential equivalences. The netlist is then simplified by consuming the sequential equivalences.

10 Claims, 14 Drawing Sheets

OTHER PUBLICATIONS

Czarnecki, Krzysztof, et al., "Feature Diagrams and Logics: There and Back Again", Proceedings of the 11th International Software Product Line Conference (SPLC'07), Kyoto, Japan, Sep. 10-14, 2007, 10 pages.

Gupta, Aarti, et al., "Lazy Constraints and SAT Heuristics for Proof-based Abstraction", Proceedings of the 18th International Conference on VLSI Design held jointly with 4th International Conference on Embedded Systems Designs (VLSID/05), Kolkata, India, Jan. 3-7, 2005, 6 pages.

Mony, Hari, et al., "Speculative Reduction-Based Scalable Redundancy Identification", Proceedings of the Conference on Design, Automation and Test in Europe, 2009, 6 pages.

Tarjan, Robert, "Depth-First Search and Linear Graph Algorithms", SIAM Journal on Computing, vol. 1, No. 2, Jun. 1972, pp. 146-160.

Van Eijk, C. A., "Sequential Equivalence Checking without State Space Traversal", Design, Automation and Test in Europe, Paris, France, Feb. 23-26, 1998, pp. 618-623.

U.S. Appl. No. 13/092,262.

U.S. Appl. No. 13/458,252.

Office Action mailed Oct. 2, 2012 for U.S. Appl. No. 13/458,534, 18 pages.

Response to Office Action filed Jan. 2, 2013, U.S. Appl. No. 13/458,534, 15 pages.

* cited by examiner

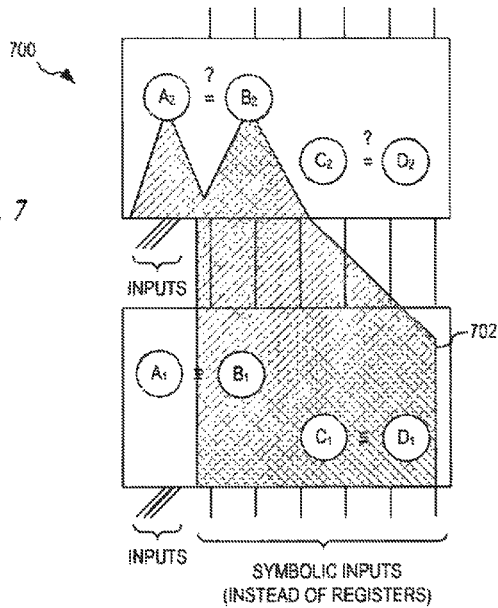

FIG. 7

```
function getStructuralDependencies(equivalence) {
  equivalence_K+1 := get the instance of the equivalence in the K+1'st transition relation
  for all gates in the cone-of-influence of equivalence_k+1 {
    if (the gate is simplified by an equivalence E) then report the dependency equivalence -> E
  }
}
```

FIG. 8

```
function testEquivalence(equivalence) {
  test equivalence with a lazy constraints SAT solver
  for all relevant constraints {
    determine which equivalence E corresponds to the constraint
    report the dependency equivalence -> E
  }
}
```

FIG. 9

```
function satisfy_another(constraint) {         1202
    fix previous assignments                   1204
    return satisfy(cnf/circuit)                1206
}
```

*FIG. 12*

```
function satisfy_lazy(cnf, constraints) {
    affectingConstraints = empty list          1302
satisfy_again:
    result = satisfy(cnf & affectingConstraints)
    if (result == satisfied) {
        for all constraints C not in affectingConstraints {
            resultC = satisfy_another(C)
            if (resultC == unsatisfiable) {
                add C to affectingConstraints
                goto satisfy_again
            } else if (resultC == inconclusive) {
                return inconclusive
            }
        }
        return satisfied
    } else if (result == unsatisfiable) {
        return unsatisfiable
    } else if (result == inconclusive) {
        return inconclusive
    }
}
```

*FIG. 13*

```
function satisfy_lazy(cnf, constraints) {
    affectingConstraints = empty list
    for all constraints C with (importance > THRESHOLD) {
        add C to affectingConstraints
    } for all constraints C {
        C.importance *= DECAY
    }
satisfy_again:
    result = satisfy(cnf & affectingConstraints)
    if (result == satisfied) {
        for all constraints C not in affectingConstraints {
            resultC = satisfy_another(C)
            if (resultC == unsatisfiable) {
                add C to affectingConstraints
                C.importance += INCREMENT
                goto satisfy_again
            } else if (resultC == inconclusive) {
                return inconclusive
            }
        }
        return satisfied
    } else if (result == unsatisfiable) {
        return unsatisfiable
    } else if (result == inconclusive) {
        return inconclusive
    }
}
```

FIG. 14

ENHANCING REDUNDANCY REMOVAL WITH EARLY MERGING

BACKGROUND

The present application relates generally to an improved data processing apparatus and method and more specifically to mechanisms for enhancing redundancy removal with early merging.

Many design automation algorithms have an objective of minimizing design size. For example, in logic synthesis, shrinking the design size is a way to save area and power on a die. In verification, shrinking the design size improves the scalability of the verification algorithms, because operating on a design of smaller size is often easier than operating on the original design. In addition, formal verification of safety properties involves finding a sequence of inputs such that a logical condition within the design is true or proving that no such sequence exists. While minimizing the size of a design, a discovery may be made that the logical condition may be replaced with a constant 0, implying that a condition may never be possible for the condition to be true and thus outright solving the formal verification problem.

One common way of minimizing the size of a design is by finding pairs of signals that are equivalent in every reachable state. If signals A and B are equivalent in every reachable state then they may be "merged," an operation that replaces references to A with B and then removes A from the design or vice-versa. Induction is commonly used to prove that pairs of signals are equivalent on all reachable states. One form of induction, known as "k-induction," involves two steps: in the "base case" a check is performed that all pairs of signals are equivalent under sequences of k states starting from any initial state. In the "inductive step," a check is performed that, for every sequence of k+1 states that start from an arbitrary state, if all equivalences hold on the first k states in the sequence then the equivalences hold on the k+1'st state.

Prior work uses a k-induction formulation to prove that a set of equivalences hold in all reachable states. The work proves all equivalences simultaneously using a greatest fixed-point routine. Equivalences which do not pass the base case or inductive step checks are discarded and the algorithm tests the remaining equivalences anew. This process guarantees that the equivalences that remain once a fixed-point is reached will hold in all reachable states. The process may be scalably applied to large designs and widely used in nearly every logic synthesis and verification tool across the EDA industry.

However, the prior work suffers from one major problem: in that the prior work does not conclude that any equivalences are valid until a fixed-point is reached and, thus, the prior work cannot simplify the design until the fixed-point is reached. If computational resources are exceeded before the fixed-point is reached, then k-induction fails to find equivalences which can simplify the design.

SUMMARY

In one illustrative embodiment, a method, in a data processing system, is provided for simplifying a netlist before computational resources are exceeded. The illustrative embodiments determine whether equivalence holds for at least one of an equivalence or an equivalence class by identifying whether the equivalence or equivalence class is either affecting or non-affecting for each of a set of suspected equivalences in a proof graph of a netlist. Responsive to the equivalence or equivalence class being affecting, the illustrative embodiments record a proof dependency as an edge in a proof graph. The illustrative embodiments determine whether the node has a falsified dependency for each node in the proof graph. Responsive to the node failing to have a falsified dependency, the illustrative embodiments identify that all dependencies are satisfied and that the equivalences represented by the node in the proof graph are sequential equivalences. The illustrative embodiments then simplify the netlist by consuming the sequential equivalences.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 7 depicts such a structural dependency extraction in accordance with an illustrative embodiment;

FIG. 8 depicts one example of a structural dependency algorithm that may be used to discover structural dependencies for multiple sets of signals in accordance with an illustrative embodiment;

FIG. 9 depicts one example of a proof dependency algorithm that may be used to mine proof dependencies from a SAT solver using a lazy constraints algorithm in accordance with an illustrative embodiment;

FIG. 12 depicts one example of a satisfy_another(constraint) algorithm in accordance with an illustrative embodiment;

FIG. 13 depicts one example of a satisfy_lazy(cnf,constraints) algorithm in accordance with an illustrative embodiment;

FIG. 14 depicts one example of a satisfy_lazy(cnf,constraints) algorithm with constraint importance in accordance with an illustrative embodiment;

DETAILED DESCRIPTION

In order to verify equivalences prior to a fixed-point and simplify a design before computational resources are exceeded, the illustrative embodiments provide a mechanism that uses a framework to track dependencies between equivalences. By using the framework to track dependencies between equivalences, the illustrative embodiments determine which equivalences will hold in all reachable states before a fixed-point is reached. These equivalences may be merged immediately and this simplification is valid even if k-induction is stopped early due to computational resource limits.

The illustrative embodiments refer to the framework as "early merging." Early merging has a profound capability for sequential redundancy removal, in that early merging allows useful reductions to be achieved quickly even on very large designs, allows for parallelization of the redundancy removal flow by allowing independent processes to identify disjoint and complementary redundancies, and allows for meaningful resource-bounding of the redundancy removal process with non-zero reduction capability.

Another advantage of early merging is with Boolean satisfiability (SAT) runtime. K-induction is an iterative procedure which tests the equivalences in base case and inductive steps using a Boolean satisfiability (SAT) solver. Equivalences that hold in all reachable states must be tested in each k-induction iteration and the equivalences will be found to be valid with each call to a SAT solver. By determining that an equivalence will hold for all reachable states and performing early merging, the equivalence may be removed from consideration in future k-induction iterations. This saves substantial computational resources that may have been spent in unnecessary calls to the SAT solver.

Early merging is enabled by a directed graph referred to as a "proof graph." The proof graph allows for determining which equivalences are candidates for early merging. Conversely, the proof graph allows for determining which equivalences may not be merged early in the current k-induction iteration. Early merging, along with the proof graph, allows the illustrative embodiments to skip calls to the SAT solver that may not lead to merges, thereby, delaying these calls to later iterations in k-induction, helping to further reduce the total number of SAT calls in k-induction, resulting in dramatic runtime improvement.

Figure 1:
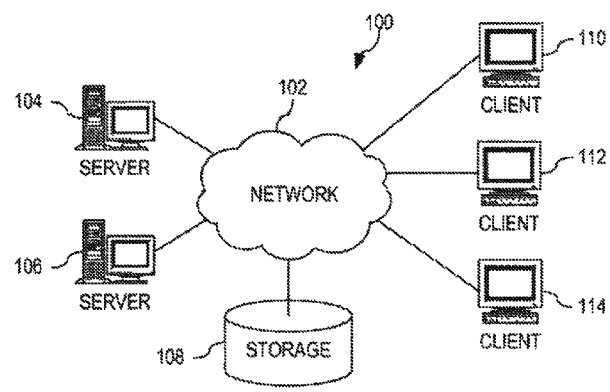
FIG. 1 depicts a pictorial representation of an example distributed data processing system in which aspects of the illustrative embodiments may be implemented.
Figure 2:
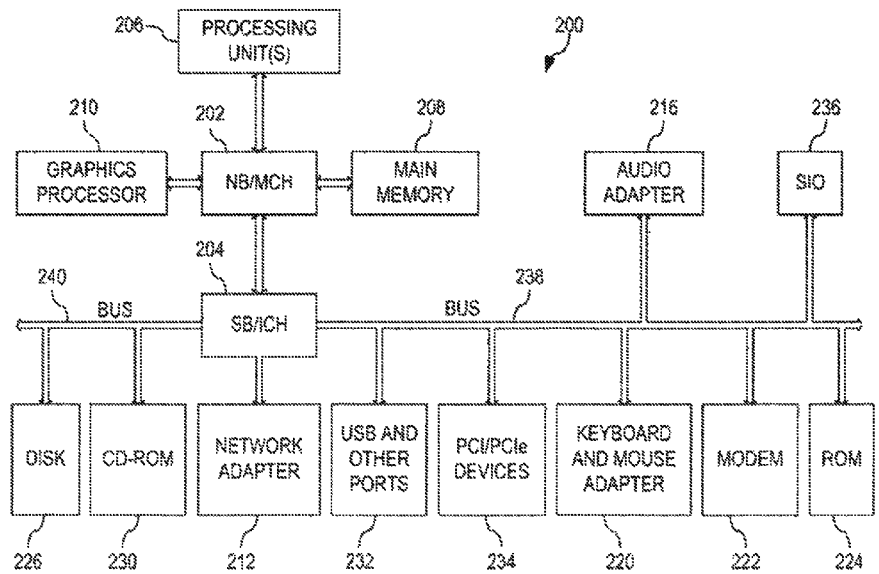
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 200 (Java is a trademark of Oracle and/or its affiliates.).

As a server, data processing system 200 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

In both logic synthesis and verification, a desire exists to prove that pairs of signals are equivalent. Such knowledge may lead to design size reductions as a netlist that is being logically synthesized and verified may be rewired to remove one of the equivalent signals.

Further, knowledge of sequential equivalences may prove to be more interesting. Sequential equivalences are pairs of signals that are equivalent on every reachable state. Such a design may be a large finite state machine, and, because not all states are reachable, the set of sequential equivalences may be larger than the set of equivalences that hold on every state. By identifying one or more sets of sequential equivalences, a greater reduction in netlist size may be realized when these sequential equivalences are used to simplify the netlist. Additionally, the set of states for which the equivalences hold may be an over-approximation or superset of the set of reachable states, and this over-approximation may be used in formal verification contexts to simplify the verification problem.

A logic synthesis and verification engine that finds sequential equivalences starts with a set of candidate equivalences. These are equivalences that possibly hold on all reachable states, but these equivalences have yet to be proven. The candidate equivalences may either be manually provided by the end user or automatically discovered using an algorithm. Commonly, random simulation is used to discover signals that appear to be equivalent.

Figure 3:
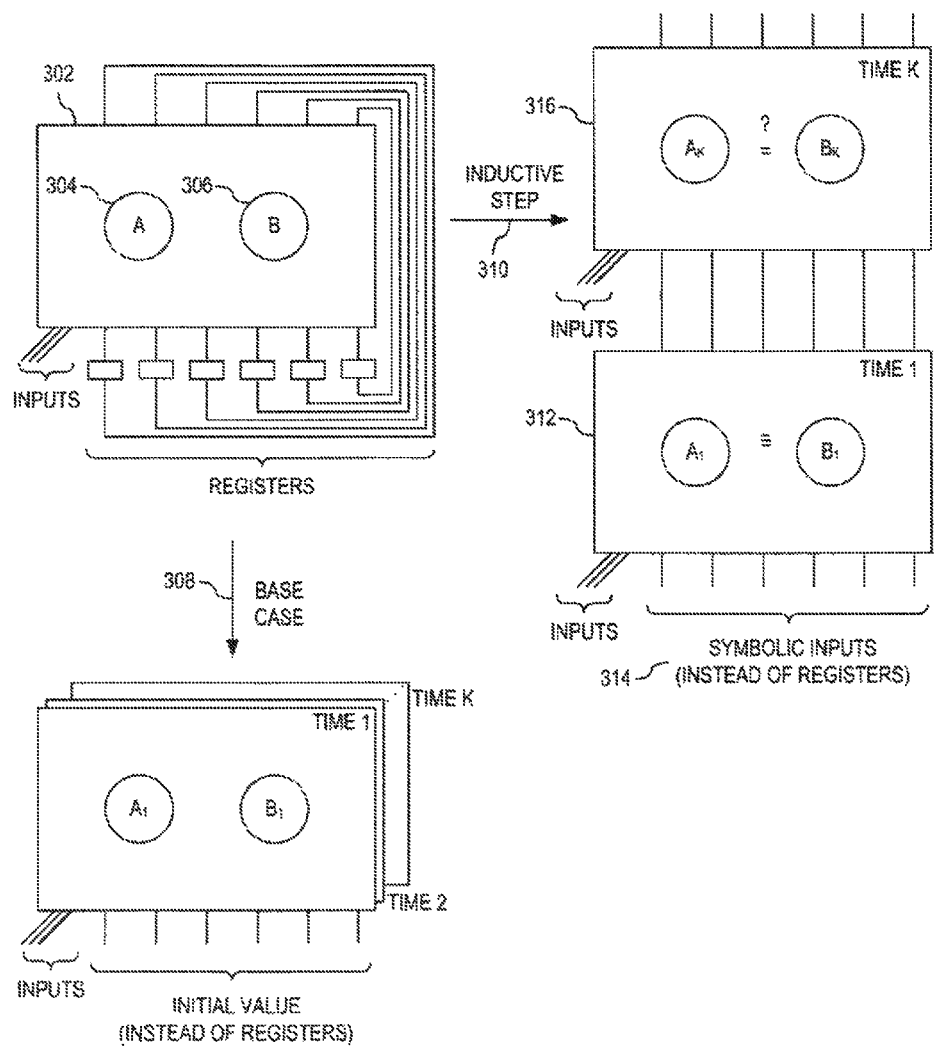
FIG. 3 depicts an example of K-induction that is commonly used to prove that the candidate equivalences are sequential equivalences in accordance with an illustrative embodiment.

FIG. 3 depicts an example of K-induction that is used to prove that the candidate equivalences are sequential equivalences in accordance with an illustrative embodiment. K-induction involves a check of whether equivalences exist for netlist 302 that includes a plurality of signals, such as signal A 304 and signal B 306 in two steps, a "base case" and an "inductive step." In "base case" 308, an induction engine determines whether signals, such as signals 304 and 306, are equivalent on all states from time 0 to time K or set of states from an initial time K. Performing the base step may be equivalent to performing bounded model checking up to depth K. In "inductive step" 310, the induction engine unrolls netlist 302 by creating multiple copies of the transition relation and feeding the next state that is output from one transition relation to the current state of the next transition relation. The state of transition relation 312 is unknown and represented with symbolic inputs 314. Thus, the induction engine asserts the equivalences at times 0 through K, shown for the K=1 case in transition relation 312, and checks the equivalency at time K+1 in transition relation 316.

If both the base case and inductive step hold, then the induction engine indicates that the equivalences of signals 304 and 306 hold in all reachable states. If a counterexample, such as an equivalence that does not hold on a transition from one state to another, is found during the inductive step, then equivalences that are violated may be true but may not be proven using K-induction. Such equivalences that may be true but may not be proven using K-induction must be discarded and the induction engine has to recheck the remaining equivalences. This defines an iterative procedure that terminates when all suspected equivalences pass the inductive step check.

The illustrative embodiments simplifies such iterative procedures by determining which equivalences are soundly proven before the induction iteration terminates. That is, the illustrative embodiments provide partial results that may be used in the event that induction step runs out of time and, thus, may be used to simplify the induction loop itself as described below.

Figure 4:
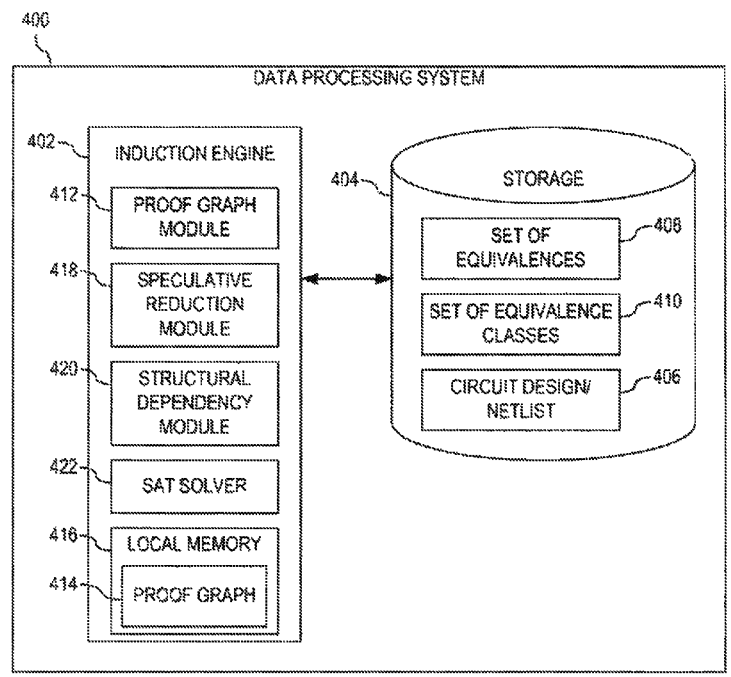
FIG. 4 depicts a functional block diagram of a mechanism that uses "early merging" to merge or simplify a netlist before a K-induction loop terminates in accordance with an illustrative embodiment.

The illustrative embodiments provide an "early merging" process that allows for merging or simplification of a netlist before a K-induction loop terminates. FIG. 4 depicts a functional block diagram of a mechanism that uses "early merging" to merge or simplify a netlist before a K-induction loop terminates in accordance with an illustrative embodiment. Data processing system 400 comprises induction engine 402 and storage 404. In operation, induction engine 402 receives input that identifies circuit design/netlist 406 to be validated as well as a set of equivalences 408 and/or a set of equivalence classes 410. Induction engine 402 then uses proof graph module 412 to build proof graph 414 with one node for each equivalence in the set of equivalences 408 and/or one node for each equivalence class in the set of equivalence classes 410 and without any edges. Induction engine 402 may store proof graph 414 on storage 404 or within local memory 416, since induction engine 402 as well as other modules within induction engine 402 will access and update proof graph 414 during the induction operation and the early merging operation.

Figure 5:
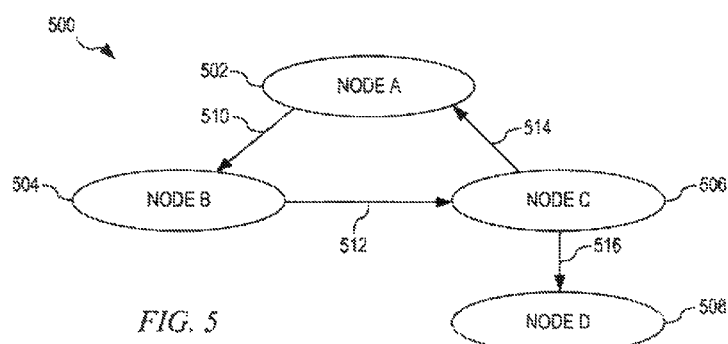
FIG. 5 depicts an exemplary proof graph in accordance with an illustrative embodiment.

FIG. 5 depicts an exemplary proof graph 500 in accordance with an illustrative embodiment. As shown, proof graph 500 comprises nodes 502, 504, 506, and 508. Each of nodes 502, 504, 506, and 508 corresponds to either a single equivalence or an equivalent class. Edges 510, 512, 514, and 516 indicate a dependency of once node on another node, for example, edge 510 indicates that node 502 depends on node 504, edge 512 indicates that node 504 depends on node 506, edge 514 indicates that node 506 depends on node 502 and edge 516 indicates that node 506 depends on node 508. There are two sources of these dependencies indicated by edges 510, 512, 514, and 516: structural dependencies and proof dependencies.

Returning to FIG. 4, in order to discover structural dependencies, induction engine 402 uses speculative reduction module 418 to speculatively reduce an unrolled netlist 406 used for the inductive step. As previously described, in K-induction, an induction engine, such as induction engine 402, asserts that suspected equivalences are asserted in a first transition relation at state K and tests the equivalencies in second transition relation at state K+1. Such an asserted equivalence may be used to simplify first K transition relations by rewiring those transition relations. Thus, speculative reduction module 418 maintains the assertion that the equivalences hold and modifies all logic that is fed by these equivalent signals.

Figure 6:
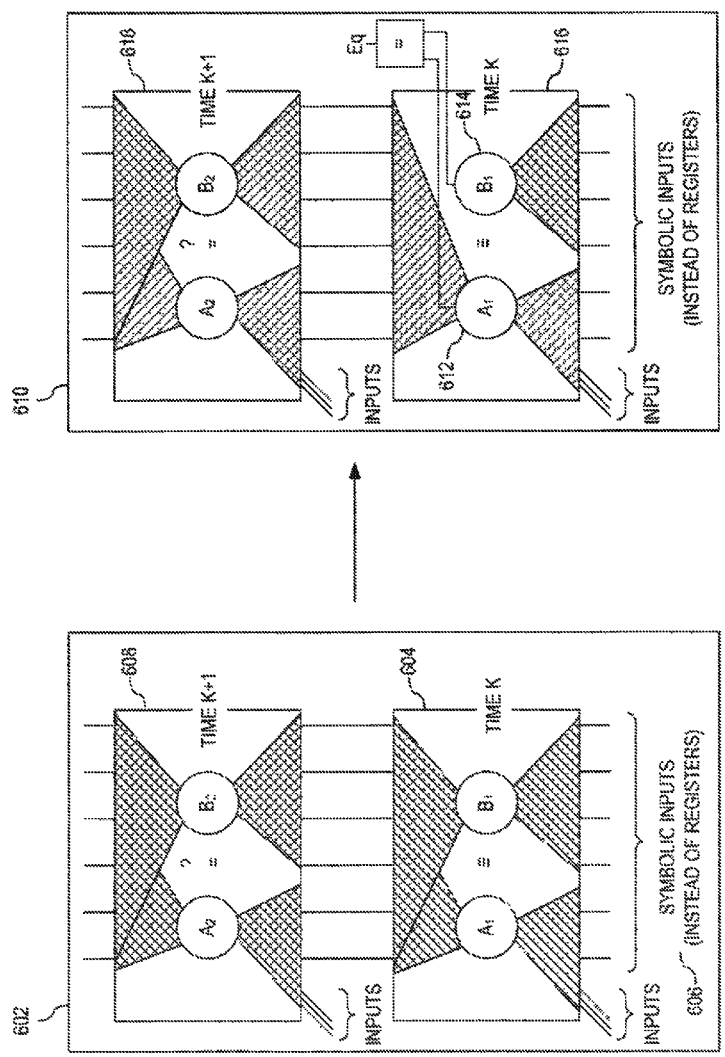
FIG. 6 depicts an exemplary speculative reduction in accordance with an illustrative embodiment.

FIG. 6 depicts an exemplary speculative reduction in accordance with an illustrative embodiment. In K-induction 602, an induction engine unrolls a netlist by creating multiple copies of the transition relation and feeding the next state that is output from one transition relation to the current state of the next transition relation. The state of transition relation 604 is unknown and represented with symbolic inputs 606. Thus, the induction engine asserts equivalences at time K in transition relation 604 and checks the equivalency at time K+1 in transition relation 608. In speculative reduction 610, a speculative reduction module initially implies a dependency at time K by asserting that signal A 612 is equal to signal B 614 at time K in transition relation 616, modifies all logic that is fed by these equivalent signals such that signal A 612 feeds all outputs from transition relation 616, and checks the equivalency at time K+1 in transition relation 618.

Returning to FIG. 4, after the speculative reduction is performed, induction engine 402 uses structural dependency module 420 to discover structural dependencies for multiple sets of signals. That is, a cone-of-influence (COI) is a set of all logic gates that either directly or indirectly affect the value of a signal. When equivalence is tested in a K+1 transition relation, the COI of the equivalent signals includes logic that has been modified by speculative reduction module 418. If the speculatively reduced equivalences are incorrect, then the test of the equivalence in the K+1 transition relation is inconclusive. Such an identification of an inconclusive result implies that the tested equivalence has a dependency on the equivalences which simplified its COI. Thus, structural dependency module 420 identifies that one set of equivalencies is dependent on another set of equivalencies. For example, if in a transition relation at time K there is an assertion that $A_1$ is equal to $B_1$ and $C_1$ is equal to $D_1$, then at time K+1 a check may be performed to determine whether the equivalency of $A_2$ being equal to $B_2$ is dependent on $A_1$ being equal to $B_1$ and $C_1$ being equal to $D_1$.

FIG. 7 depicts such a structural dependency extraction in accordance with an illustrative embodiment. In structural dependency extraction 700, cone-of-influence (COI) 702 indicates that the equivalency of A2 being equal to B2 is dependent on $B_1$ as well as $C_1$ being equal to $D_1$. Thus, for A to be equal to B there is a dependency that C is equal to D.

Returning to FIG. 4, as structural dependency module 420 discovers structural dependencies for multiple sets of signals, structural dependency module 420 records each structural dependency as an edge in proof graph 414. FIG. 8 depicts one example of a structural dependency algorithm that may be used to discover structural dependencies for multiple sets of signals in accordance with an illustrative embodiment. In structural dependencies algorithm 800 at line 802, each instance of the equivalence in the K+1'st transition relation is obtained. Then in section 804, for all gates in the cone-of-influence of equivalence K+1, if the gate is simplified by an equivalence E, then the dependency equivalence is recorded.

In addition to the structural dependencies for netlist 406 identified in structural dependency module 420, there may also be proof dependencies. To test for proof dependencies, induction engine 402 utilizes a Boolean satisfiability (SAT) solver 422 that supports lazy constraints. The operation performed by SAT solver 422 is described in detail below with regard to FIG. 11. SAT solver 422 determines whether equivalence holds and also identifies which constraints are relevant or affecting and which constraints are non-affecting. In the illustrative embodiments, SAT solver 422 uses the set of all asserted equivalences as constraints and, through the use of a lazy constraint algorithm, SAT solver 422 identifies which assertions or constraints are relevant. If an assertion is relevant or affecting, SAT solver 422 identifies that the proof depends on the underlying equivalence that was asserted. If the asserted equivalence is not relevant or non-affecting, then SAT solver 422 identifies that the proof is unsound. In this way, the equivalence being tested is dependent on the asserted equivalence. Induction engine 402 records each proof dependency identified by SAT solver 422 as another edge in proof graph 414. Additionally, if SAT solver 422 identifies an asserted equivalence as not relevant or non-affecting, then induction engine 402 removes either the equivalence from the set of equivalences 408 or the equivalence class from the set of equivalence classes 410. Thus, the equivalence or the equivalence class will not be considered in any future K-induction iterations.

FIG. 9 depicts one example of a proof dependency algorithm that may be used to mine proof dependencies from a SAT solver using a lazy constraints algorithm in accordance with an illustrative embodiment. In test equivalence (equivalence) algorithm 900 each equivalence is tested with a lazy constraints SAT solver. Thus, at section 902, for all relevant constraints, a determination is made as to which equivalence E corresponds to the constraint. At line 904, the then the dependency equivalence is recorded.

After all equivalences are tested, induction engine 402 uses generated proof graph 414 to determine which equivalences may be merged early. Induction engine 402 loops over all nodes in proof graph 414 and tests whether each node has a falsified dependency. In general, a node has a falsified dependency if there is any path from the node to another node whose equivalences were falsified when tested with SAT solver 422 during the inductive step tests. If there is no path along the edges of the proof graph to a falsified node, then induction engine 402 identifies that all of the dependencies are satisfied and that the equivalences represented by the node in proof graph 414 are sequential equivalences. Using the identified sequential equivalences, induction engine 402 merges and/or simplifies netlist 406 or consumes the sequential equivalence in some application-defined manner. Induction engine 402 then removes the redundant signal from future consideration. For example, if the early merging process identifies and verifies that A is truly equal to B in all states, then induction engine 402 modifies netlist 406 so that all references to signal B are changed to signal A and removes signal B from netlist 406. After induction engine 402 extracts the early merging information from proof graph 414, induction engine 402 begins the next K-induction iteration on any remaining equivalences. If there are no remaining equivalences, then induction engine 402 terminates is verification of netlist 406.

Figure 10:
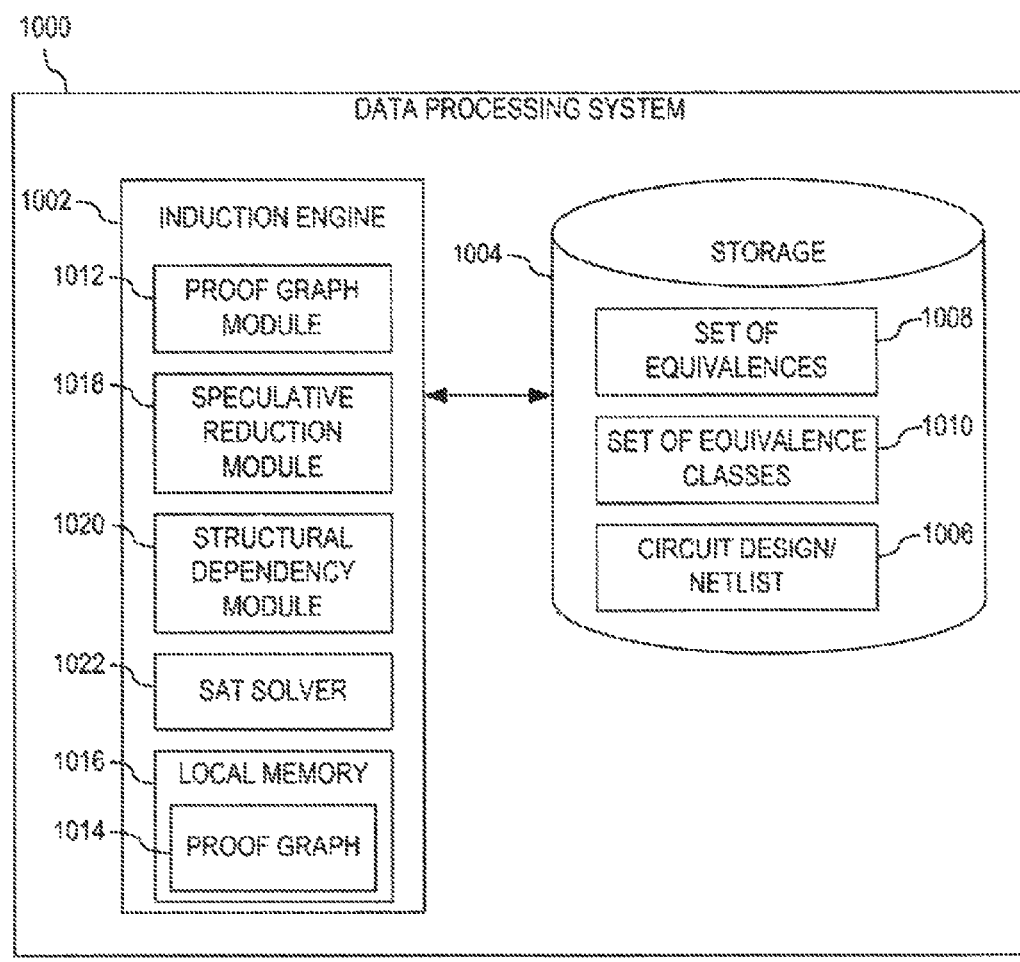
FIG. 10 depicts a functional block diagram of a mechanism that uses "early merging" to merge or simplify a netlist as well as simplify the K-induction loop itself in accordance with an illustrative embodiment.

While the illustrative embodiment described in FIG. 4 allows for equivalences to be soundly proved before the K-induction loop terminates, the described operation does not simplify the K-induction loop itself However, in a further illustrative embodiment the overall K-induction operation may be made more efficient. FIG. 10 depicts a functional block diagram of a mechanism that uses "early merging" to merge or simplify a netlist as well as simplify the K-induction loop itself in accordance with an illustrative embodiment. Data processing system 1000 comprises induction engine 1002 and storage 1004. In operation, induction engine 1002 receives input that identifies circuit design/netlist 1006 to be validated as well as a set of equivalences 1008 and/or a set of equivalence classes 1010. Induction engine 1002 then uses proof graph module 1012 to build proof graph 1014 with one node for each equivalence in the set of equivalences 1008 and/or one node for each equivalence class in the set of equivalence classes 1010 and without any edges. Induction engine 1002 may store proof graph 1014 on storage 1004 or within local memory 1016, since induction engine 1002 as well as other modules within induction engine 1002 will access and update proof graph 1014 during the induction operation and the early merging operation.

In order to discover structural dependencies, induction engine 1002 uses speculative reduction module 1018 to speculatively reduce an unrolled netlist 1006 used for the inductive step. As previously described, in K-induction, an induction engine, such as induction engine 1002, asserts that suspected equivalences are asserted in a first transition relation at state K and tests the equivalencies in second transition relation at state K+1. Such an asserted equivalence may be used to simplify first K transition relations by rewiring those transition relations. Thus, speculative reduction module 1018 maintains the assertion that the equivalences hold and modifies all logic that is fed by these equivalent signals.

After the speculative reduction is performed, induction engine 1002 uses structural dependency module 1020 to discover structural dependencies for multiple sets of signals. That is, a cone-of-influence (COI) is a set of all logic gates that either directly or indirectly affect the value of a signal. When equivalence is tested in a K+1 transition relation, the COI of the equivalent signals includes logic that has been modified by speculative reduction module 1018. If the speculatively reduced equivalences are incorrect, then the test of the equivalence in the K+1 transition relation is inconclusive. Such an identification of an inconclusive result implies that the tested equivalence has a dependency on the equivalences which simplified its COI. Thus, structural dependency module 1020 identifies that one set of equivalencies is dependent on another set of equivalencies. As structural dependency module 1020 discovers structural dependencies for multiple sets of signals, structural dependency module 1020 records each structural dependency as an edge in proof graph 1014. Thus, up to this point, the operation performed by induction engine 1002 has been similar to the operation performed by induction engine 402 of FIG. 4.

However, at this point, induction engine 1002 now performs a recursive procedure for each node in proof graph 1014 to prove the single proof graph node. In this operation, induction engine 1002 determines whether the current proof graph node has already been tested. If induction engine determines that the current proof graph node has not been tested, then induction engine 1002 loops over all child nodes of the current proof graph node or nodes that have an incident edge coming from the current proof graph node in proof graph 1014. If induction engine 1002 identifies that the child node has a path to a node whose represented equivalence was falsified when tested with SAT solver 1022, then induction engine 1002 identifies that the child node has a falsified dependency and by extension the current proof graph node has a falsified dependency. In this case, induction engine 1002 determines that early merging at the current proof graph node may not occur and marks the current proof graph node as non-testable. Note that, by induction engine 1002 marking the current proof graph node as non-testable, the number of tests that need to be performed is dramatically reduced thereby decreasing the testing time performed by induction engine 1002.

If induction engine 1002 identifies that the child node fails to have a path to a falsified node, then induction engine 1002 checks all of the remaining child nodes for the current proof graph. If all child nodes for the current proof graph node fail to have a path to a falsified node, then induction engine 1002 tests the equivalences represented by the current proof graph node by utilizing a Boolean satisfiability (SAT) solver 1022 that supports lazy constraints. The operation performed by SAT solver 1022 is described in detail below with regard to FIG. 11. SAT solver 1022 determines whether equivalence holds and also identifies which constraints are relevant or affecting and which constraints are non-affecting. In the illustrative embodiments, SAT solver 1022 uses the set of all asserted equivalences as constraints and, through the use of a lazy constraint algorithm, SAT solver 1022 identifies which assertions or constraints are relevant. If an assertion is relevant or affecting, SAT solver 1022 identifies that the proof depends on the underlying equivalence that was asserted. If the asserted equivalence is not relevant or non-affecting, then SAT solver 1022 identifies that the proof is unsound. In this way, the equivalence being tested is dependent on the asserted equivalence. Induction engine 1002 records each proof dependency identified by SAT solver 1022 as another edge in proof graph 1014. Additionally, if SAT solver 1022 identifies an asserted equivalence as not relevant or non-affecting, then induction engine 1002 removes either the equivalence from the set of equivalences 1008 or the equivalence class from the set of equivalence classes 1010. Thus, the equivalence or the equivalence class will not be considered in any future K-induction iterations.

If SAT solver 1022 identifies additional proof graph children as a result of adding edges that correlate to proof dependencies, then induction engine 1002 re-verifies that all child nodes fail to have a path to a falsified node. If SAT solver 1022 fails to identify new children and the equivalences at the current proof graph node passes, then induction engine 1002 identifies the equivalences of the current proof graph nodes as soundly proven and sequential equivalences. Using the identified sequential equivalences, induction engine 1002 merges and/or simplifies netlist 1006 or consumes the sequential equivalence in some application-defined manner. Induction engine 1002 then removes the redundant signal from future consideration. Induction engine 1002 then proceeds to process the next proof graph node if another proof graph node remains to be tested.

Thus, the illustrative embodiments simplify such iterative procedures by determining which equivalences are soundly proven before the induction iteration terminates. The illustrative embodiments provide partial results that may be used in the event that induction step runs out of time, thus the partial results may be used to simplify the induction loop itself.

Figure 11:
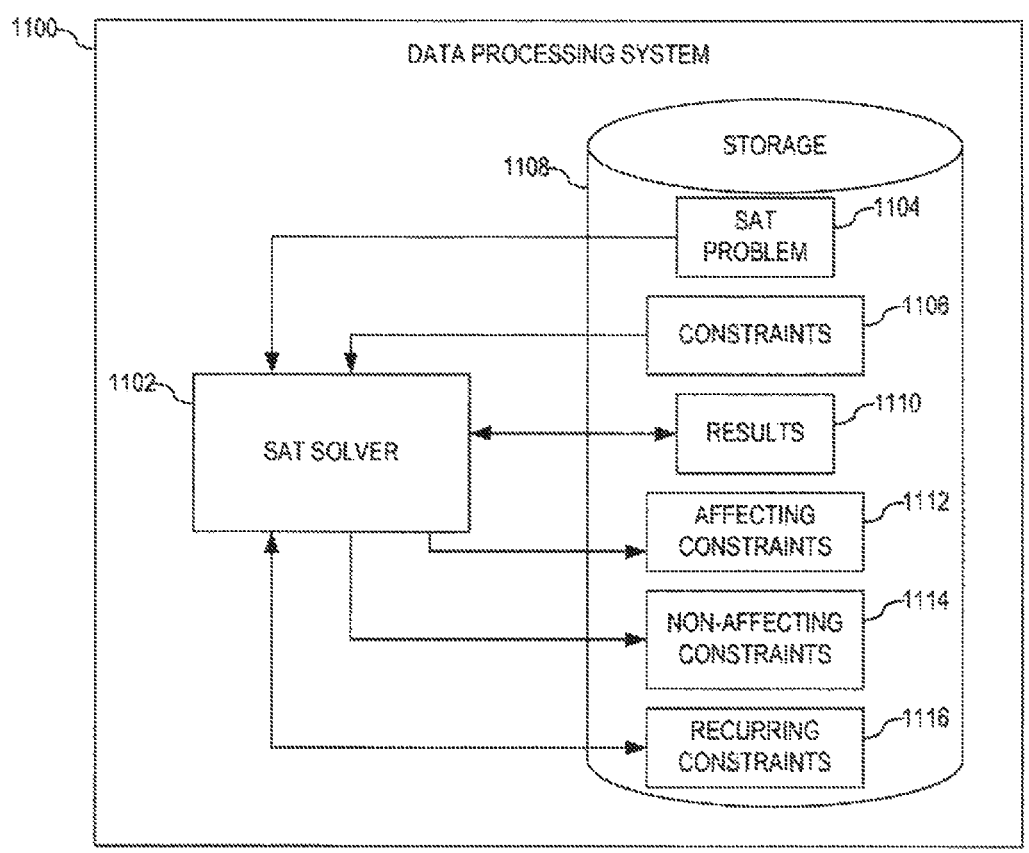
FIG. 11 depicts a block diagram of a mechanism for efficiently determining Boolean satisfiability with "lazy constraints" for a Boolean satisfiability (SAT) problem in accordance with an illustrative embodiment.

FIG. 11 depicts a block diagram of a mechanism for efficiently determining Boolean satisfiability with "lazy constraints" for a Boolean satisfiability (SAT) problem in accordance with an illustrative embodiment. The SAT problem may be represented either in a conjunctive normal form (cnf) or as a circuit and, with reference to the previous description, the SAT problem may be a node. Data processing system 1100 comprises SAT solver 1102 which receives inputs of SAT problem 1104 and list of constraints 1106, which may both be stored in storage 1108.

Initially, SAT solver 1102 uses a satisfy(cnf/circuit) algorithm to verify whether SAT problem 1104 may be satisfied without any constraints in list of constraints 1106 being applied. Using the satisfy(cnf/circuit) algorithm, SAT solver 1102 provides one of three results 1110 for SAT problem 1104: satisfiable, unsatisfiable, or inconclusive. Satisfiable indicates that an assignment to variables of SAT problem 1104 was found such that the logical relationships in the SAT problem all evaluate to 1. Unsatisfiable indicates that no such assignment to variables of SAT problem 1104 exists. Modern SAT solvers can provide an "unsatisfiable core" that indicates which parts of the problem are responsible for the unsatisfiability. Inconclusive indicates that SAT solver 1102 was unable to find a satisfying assignment for some reason other than unsatisfiability. This return value is often used to indicate that SAT solver's 1102 computational resources were exhausted before SAT solver 1102 finished its search.

After satisfy(cnf/circuit) finds that its problem is satisfiable, SAT solver 1102 selects a first constraint from list of constraints 1106 and uses a satisfy_another(constraint) algorithm to verify whether SAT problem 1104 may be satisfied with the first constraint. Using the satisfy_another(constraint) algorithm, SAT solver 1102 provides one of the three results 1110 for SAT problem 1104 with the first constraint, either satisfiable, unsatisfiable, or inconclusive. If the SAT problem 1104 with the first constraint is satisfiable, the satisfy_another (constraint) algorithm is used to satisfy one additional constraint without changing the assignments to the existing variables. In this way, the assignment to variables of SAT problem 1104 may be extended to satisfy one additional constraint that was not present in the original problem. An indication of unsatisfiable by SAT solver 1102 using the satisfy_another (constraint) algorithm does not indicate that SAT problem 1104, along with previously satisfied constraints, plus the current constraint is unsatisfiable. Rather, an indication of unsatisfiable by SAT solver 1102 using the satisfy_another (constraint) algorithm merely indicates that SAT problem 1104, along with previously satisfied constraints, plus the current constraint may not be satisfied using the set of currently assigned variables. However, there may be some other set of variable assignments in which SAT problem 1104, along with previously satisfied constraints, plus the current constraint is satisfiable.

FIG. 12 depicts one example of a satisfy_another(constraint) algorithm in accordance with an illustrative embodiment. In satisfy_another(constraint) algorithm 1200 line 1202, satisfy_another(constraint) algorithm 1200 illustrates the addition of one additional constraint. At line 1204, satisfy_another(constraint) algorithm 1200 fixes the previous assignments that satisfied the SAT problem with or without previous constraints. Then at line 1206, satisfy_another(constraint) algorithm 1200 runs the satisfy(cnf/circuit) algorithm with the new constraint.

Returning to FIG. 11, the illustrative embodiments use the satisfy(cnf/circuit) algorithm and the satisfy_another(constraint) algorithm, as well as other steps, to form a "lazy constraint" algorithm, which is referred to a satisfy_lazy(cnf, constraints) algorithm. SAT solver 1102 uses the satisfy_lazy (cnf,constraints) algorithm to solve SAT problem 1104 in either a conjunctive normal form (cnf) or circuit form along with list of constraints 1106 and returns results 1110, which may be either satisfiable, unsatisfiable, or inconclusive. In this way, the satisfy_lazy(cnf,constraints) algorithm replaces satisfy(cnf/circuit) in most applications, which provides for a lazy constraint scheme to benefit many applications with only minor changes to SAT solver 1102.

In operation, SAT solver 1102 uses the satisfy_lazy(cnf, constraints) algorithm to solve SAT problem 1104 along with the constraints in list of constraints 1106. The satisfy_lazy (cnf,constraints) algorithm creates a list of affecting constraints 1112 to track which constraints that directly affect SAT problem 1104, as well as a list of non-affecting constraints 1114, to track which constraints do not directly affect SAT problem 1104. Initially, the satisfy_lazy(cnf,constraints) algorithm verifies whether SAT problem 1104 may be satisfied without any constraints in list of constraints 1106 being applied and provides one of three results 1110 for SAT problem 1104: satisfiable, unsatisfiable, or inconclusive.

If the satisfy_lazy(cnf,constraints) algorithm determines that SAT problem 1104 without any constraints is inconclusive, then adding additional constraints will not make SAT problem 1104 conclusive, and the satisfy_lazy(cnf,constraints) algorithm returns inconclusive result 1110 to SAT solver 1102. If the satisfy_lazy(cnf,constraints) algorithm determines that SAT problem 1104 without any constraints is unsatisfiable, i.e. no variable assignments could be determined to satisfy SAT problem 1104, then adding additional constraints to SAT problem 1104 will not affect this unsatisfiability. The satisfy_lazy(cnf,constraints) algorithm returns unsatisfiable result 1110 to SAT solver 1102.

If the satisfy_lazy(cnf,constraints) algorithm determines that SAT problem 1104 without any constraints is satisfiable, then the satisfy_lazy(cnf,constraints) algorithm begins a loop over all constraints in list of constraints 1106 by first fixing the variable assignments that were determined in satisfying SAT problem 1104 without any constraints. Using a satisfy_another(constraint) portion of the satisfy_lazy(cnf,constraints) algorithm, the satisfy_lazy(cnf,constraints) algorithm determines whether SAT problem 1104 can be verified with the constraint. That is, the satisfy_lazy(cnf,constraints) algorithm determines whether the addition of a constraint from list of constraints 1106 results in the variable assignments that were determined in satisfying SAT problem 1104 without any constraints stay (satisfied), changes (unsatisfied), or is inconclusive (timeout).

If the addition of a constraint from the list of constraints to SAT problem 1104 results in a result of inconclusive, then adding additional constraints will not make SAT problem 1104 with constraints conclusive, and the satisfy_lazy(cnf,constraints) algorithm returns inconclusive result 1110 to SAT solver 1102. If the addition of a constraint from list of constraints 1106 to SAT problem 1104 results in a result of satisfied, then the satisfy_lazy(cnf,constraints) algorithm adds the currently added constraint to list of non-affecting constraints 1114. While the addition of the constraint resulted in the result of satisfied with the variable assignments being fixed, other variables may be determined that are required to satisfy SAT problem 1104 with the constraint. That is, the addition of the constraint may require other inputs that were not required by the original SAT problem 1104 and thus were not fixed. The determination of such variable assignments does not result in an unsatisfiable, rather just a new variable assignment that needs to be fixed upon the addition of a new constraint. The satisfy_lazy(cnf,constraints) algorithm then adds another constraint from list of constraints 1106 and verifies whether SAT problem 1104 can be verified using the fixed variable assignments plus any new fixed variable added by a previously verified constraint.

If the addition of a constraint from list of constraints 1106 to SAT problem 1104 results in a result of unsatisfied, then the satisfy_lazy(cnf,constraints) algorithm determines that the existing fixed variable assignments are inconsistent with this new constraint. The satisfy_lazy(cnf,constraints) algorithm adds the currently added constraint to list of affecting constraints 1112 and then uses the satisfy(cnf/circuit) algorithm to verify whether SAT problem 1104 may be satisfied with the previously added constraints and the current constraint from list of constraints 1106. If the satisfy_lazy(cnf,constraints) algorithm determines that SAT problem 1104 with the previously added constraints and the current constraint is inconclusive, then adding additional constraints will not make SAT problem 1104 conclusive, and the satisfy_lazy(cnf,constraints) algorithm returns inconclusive result 1110 to SAT solver 1102.

If the satisfy_lazy(cnf,constraints) algorithm determines that SAT problem 1104 with the previously added constraints and the current constraint is unsatisfiable, i.e. no variable assignments could be determined to satisfy SAT problem 1104, then adding additional constraints to SAT problem 1104 will not affect this unsatisfiability. The satisfy_lazy(cnf,constraints) algorithm returns unsatisfiable result 1110 to SAT solver 1102. If the satisfy_lazy(cnf,constraints) algorithm determines that SAT problem 1104 with the previously added constraints and the current constraint is satisfiable, then the satisfy_lazy(cnf,constraints) algorithm again begins to a loop over the remaining constraints in list of constraints 1106 using a new set of fixed variable assignments in the manner described above.

FIG. 13 depicts one example of a satisfy_lazy(cnf,constraints) algorithm in accordance with an illustrative embodiment. In satisfy_lazy(cnf,constraints) algorithm 1300 at line 1302, satisfy_lazy(cnf,constraints) algorithm 500 sets a list of affecting constraints to empty. In section 1304, satisfy_lazy (cnf,constraints) algorithm 1300 determines whether the SAT problem may be satisfied with or without constraints in the list of constraints and provides one of three results for the SAT problem: satisfiable, unsatisfiable, or inconclusive, as has been previously described.

Returning to FIG. 11, it is common for a SAT solver, such as SAT solver 1102, to be called on a series of related SAT problems, which may be known as "incremental SAT." Often, the list of constraints does not change as the SAT solver 1102 transitions from one SAT problem to a related SAT problem. In this way, any optimization to the constraints may be used to speed up the series of related calls to SAT solver 1102. As has been shown previously, the satisfy_lazy(cnf,constraints) algorithm "learns" which constraints affect satisfiability, list of affecting constraints 1112, and which constraints do not affect satisfiability, list of non-affecting constraints 1114. The set of constraints that affect satisfiability usually varies only minimally between related SAT problems. Computational resources are spent to learn this set of constraints that affect satisfiability and, by remembering the relevancy across series of calls to SAT solver 1102, duplicate work may be avoided by SAT solver 1102 and incremental SAT applications may be sped up.

Therefore, as SAT solver completes one SAT problem, SAT solver 1102 adds the constraints in the list of affecting constraints 1112 to a list of recurring constraints 1116. In order to enhance the satisfy_lazy(cnf,constraints) algorithm, each constraint in list of recurring constraints 1116 is associated with an "importance", such as a numeric representation of how relevant that constraint has been in the past. As one example, a higher importance may indicate higher relevancy, where the importance of each constraint starts at 0, although other types of indicators may be used without departing from the sprit and scope of the invention.

When the satisfy_lazy(cnf,constraints) algorithm starts on the next SAT problem, satisfy_lazy(cnf,constraints) algorithm looks to see which constraints in list of recurring constraints 1116 have importance higher than a predetermined threshold. The satisfy_lazy(cnf,constraints) algorithm identifies that these constraints were highly relevant in the solving of previous SAT problems and, thus, hypothesizes that any constraint in list of recurring constraints 1116 that is also in the new list of constraints 1106 may be useful in the current SAT problem 1104 as well. Thus, the satisfy_lazy(cnf,constraints) algorithm adds any constraint in list of recurring constraints 1116 that is also in the new list of constraints 1106 to the new list of affecting constraints 1112.

In order to ensure that a constraint that is relevant for one SAT problem and then not relevant in a series of related SAT problems may be "un-learned by the satisfy_lazy(cnf,constraints) algorithm, SAT solver 1102 decays or decrements the importance of all constraints in list of recurring constraints 1116 by multiplying the importance variables by a fixed constant decay value, which may be less than 1 and may eventually return the importance of the constraint to its ground state. Likewise, whenever a constraint is added to the list of affecting constraints 1112, that constraint affects the satisfiability of the current SAT problem. Thus, when SAT solver 1102 completes a SAT problem and the constraints in the list of affecting constraints 1112 are added to a list of recurring constraints 1116, for any constraint in list of affecting constraints 1112 that is already in list of recurring constraints 1116, SAT solver 1102 adds a constant increment value to that constraint's importance. Thus the relationship between the increment value and the predetermined threshold value determines the number of times a constraint must be relevant before it is eagerly enabled in future SAT problems.

FIG. 14 depicts one example of a satisfy_lazy(cnf,constraints) algorithm with constraint importance in accordance with an illustrative embodiment. In satisfy_lazy(cnf,constraints) algorithm 1400 at line 1402, satisfy_lazy(cnf,constraints) algorithm 1400 sets a list of affecting constraints to empty. In section 1404, satisfy_lazy(cnf,constraints) algorithm 1400 adds the constraints in the list of affecting constraints for a previous SAT problem to a list of recurring affecting constraints. In section 1406, satisfy_lazy(cnf,constraints) algorithm 1400 decays or decrements the importance of all constraints in the list of recurring affecting constraints. In section 1408, satisfy_lazy(cnf,constraints) algorithm 1400 determines whether the SAT problem may be satisfied with or without constraints in the list of constraints and provides one of three results for the SAT problem: satisfiable, unsatisfiable, or inconclusive, as has been previously described. In line 1410, satisfy_lazy(cnf,constraints) algorithm 1400 adds a constant increment value to a constraint in the current list of affecting constraints that is already in list of recurring affecting constraints.

Therefore, the proposed lazy constraint scheme of the illustrative embodiments may be implemented on top of any existing SAT solver. The satisfy_lazy(cnf,constraints) algorithms shown in FIGS. 13 and 14 make use of the satisfy_another() algorithm shown in FIG. 12. The satisfy_another(constraint) algorithm may be implemented inside of any SAT solver. However, in some SAT solvers it may not be efficient to call the satisfy_another(constraint) algorithm on each of a large number of constraints. When the number of constraints are large, an alternate satisfy_another_vec(cnf,constraints) algorithm may be implemented to satisfy a vector, group, or partition of constraints in a single call.

Returning to FIG. 11, in operation, the satisfy_another_vec (cnf,constraints) algorithm partitions list of constraints 1106 into a number N of partitions based on an importance associated with the constraints. The importance of each constraint may be identified by an administrator or determined by SAT solver 1102 based on an effect of a constraint as described above. Thus, for example, the satisfy_another_vec(cnf,constraints) algorithm may partition list of constraints 1106 into two partitions where one partition has an importance greater than a predetermined threshold and the second partition has an importance between zero and the predetermined threshold.

The satisfy_another_vec(cnf,constraints) algorithm proceeds in a manner identical to the satify_lazy(cnf,constraints) algorithm shown in FIG. 6 until the satisfy(cnf/circuit) portion of the satisfy_lazy(cnf,constraints) algorithm returns satisfied result 1110. When the satisfy(cnf/circuit) portion returns the satisfied result 1110, the satisfy_lazy(cnf,constraints) algorithm calls the satisfy_another vec(cnf,constraints) portion of the satisfy_lazy(cnf,constraints) algorithm on each constraint partition in an attempt to extend the counterexample to all constraints in the constraint partition. Because of partitioning, the satisfy_another_vec(cnf,constraints) portion is more granular than prior eager constraint methods and more course than the satisfy_lazy(cnf,constraints) algorithms of FIGS. 13 and 14.

The "resultP" variable captures the value returned by the satisfy_another_vec(cnf,constraints) portion when called on constraint partition P. If the result in resultP is unsatisfiable then, similar to previously discussed satisfy_lazy(cnf,constraints) algorithms, the existing assignment is not compatible with at least one constraint in constraint partition P. To determine which constraint in constraint partition P is responsible, satisfy_another_vec(cnf,constraints) portion inspects the unsatisfiable constraint partition P, which may also be referred to as an unsatisfiable core, to identify the reason that resultP is unsatisfiable. Constraints in constraint partition P that appear in the unsatisfiable core are relevant to the problem. As before, these constraints are added to list of affecting constraints 1112 and their importance attributes are updated in list of recurring constraints 1116.

Partitioning constraints and handling constraints in a partition-wise manner with the satisfy_another_vec(cnf,constraints) algorithm has proven to be useful in achieving significant speedups in the satisfy_lazy(cnf,constraints) algorithm for SAT solvers that fail to handle individual satisfy_another(constraint) algorithm calls efficiently.

Figure 15:
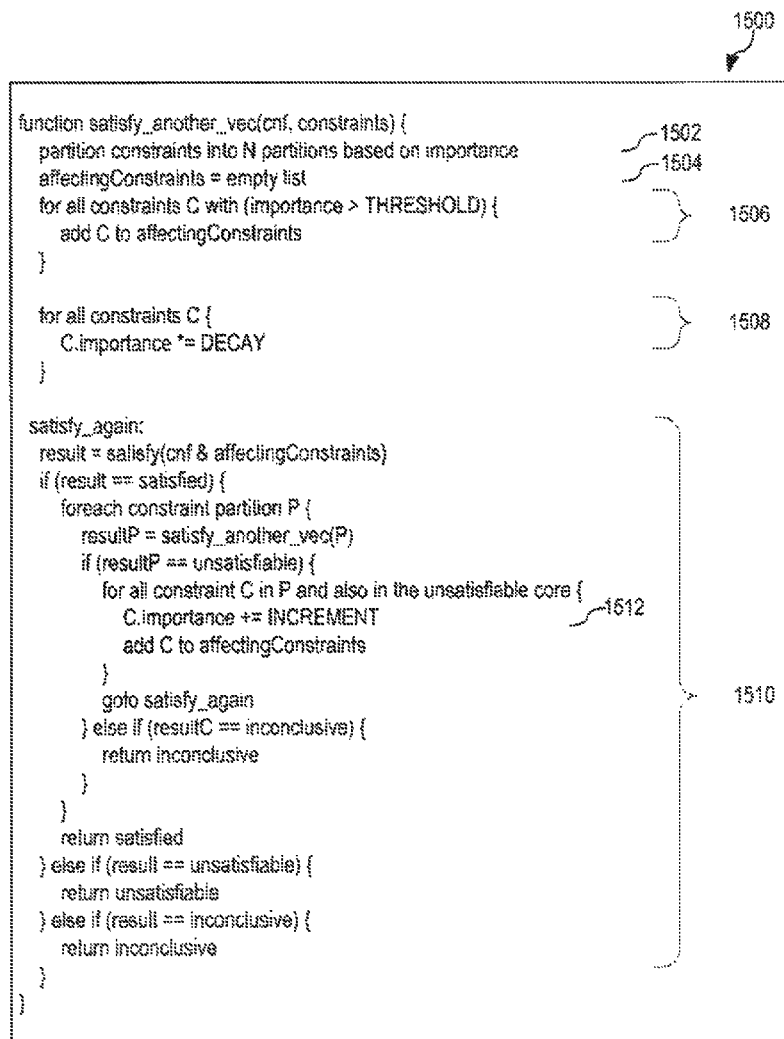
FIG. 15 depicts one example of a satisfy_lazy(cnf,constraints) algorithm that uses a satisfy_another_vec(cnf,constraints) algorithm in accordance with an illustrative embodiment.

FIG. 15 depicts one example of a satisfy_lazy(cnf,constraints) algorithm that uses a satisfy_another_vec(cnf,constraints) algorithm in accordance with an illustrative embodiment. In satisfy_another_vec(cnf,constraints) algorithm 1500 at line 1502, satisfy_another_vec(cnf,constraints) algorithm 1500 partitions the list of constraints into at least two partitions where one partition has an importance greater than a predetermined threshold and the second partition has an importance between zero and the predetermined threshold. At line 1504, satisfy_another_vec(cnf,constraints) algorithm 1500 sets the list of a list of affecting constraints to empty. In section 1506, satisfy_another_vec(cnf,constraints) algorithm 1500 adds the constraints in the list of affecting constraints for a previous SAT problem to a list of recurring affecting constraints. In section 1508, satisfy_another_vec(cnf,constraints) algorithm 1500 decays or decrements the importance of all constraints in the list of recurring affecting constraints. In section 1510, satisfy_another_vec(cnf,constraints) algorithm 1500 determines whether the SAT problem may be satisfied with or without constraints in the list of constraints and provides one of three results for the SAT problem: satisfiable, unsatisfiable, or inconclusive, as has been previously described. In line 1512, satisfy_another_vec(cnf,constraints) algorithm 1500 adds a constant increment value to a constraints in the current list of affecting constraints that is already in list of recurring affecting constraints.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 16:
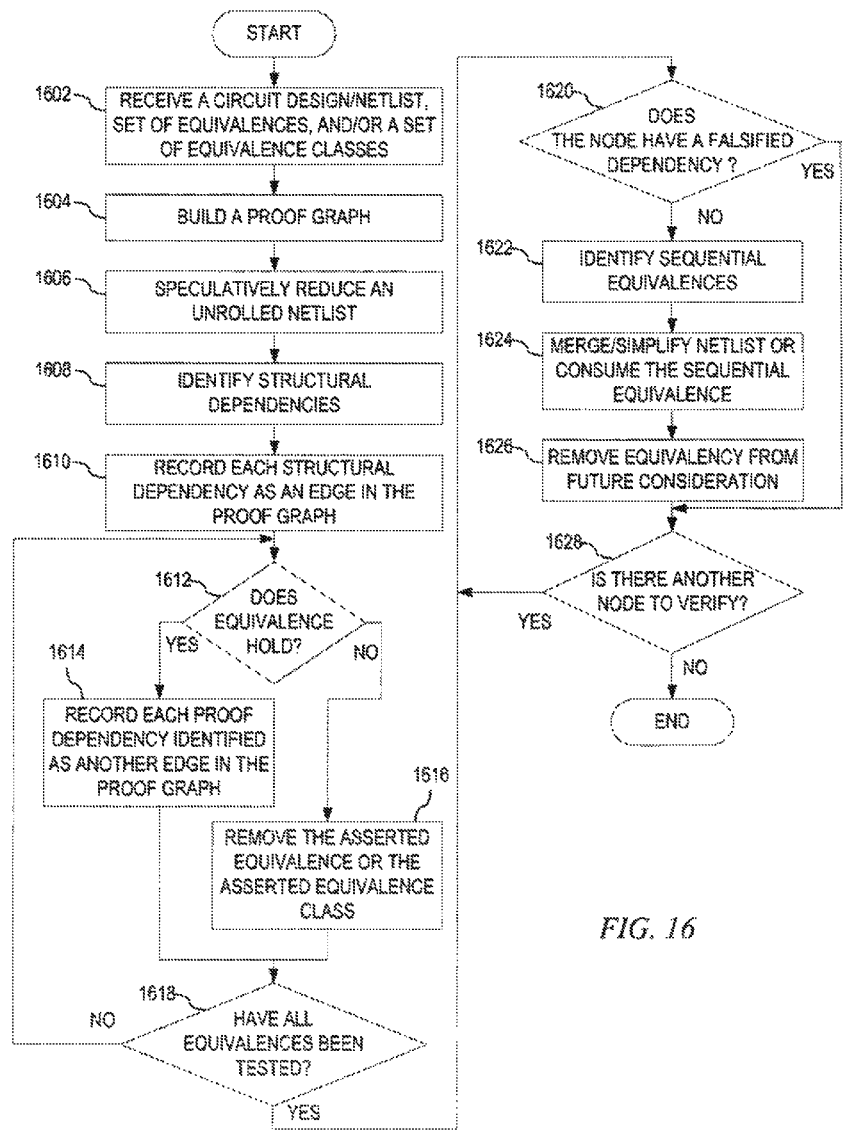
FIG. 16 depicts a flowchart outlining example operations performed by an induction engine for merging or simplifying a netlist before a K-induction loop terminates in accordance with an illustrative embodiment.

FIG. 16 depicts a flowchart outlining example operations performed by an induction engine for merging or simplifying a netlist before a K-induction loop terminates in accordance with an illustrative embodiment. As the operation begins, an induction engine receives input that identifies a circuit design/netlist to be validated as well as a set of equivalences and/or a set of equivalence classes (step 1602). The induction engine then builds a proof graph with one node for each equivalence in the set of equivalences and/or one node for each equivalence class in the set of equivalence classes and without any edges (step 1604). In order to discover structural dependencies of the proof graph, the induction engine speculatively reduces an unrolled netlist (step 1606). In K-induction, the induction engine asserts that suspected equivalences are asserted in a first transition relation at state K and tests the equivalencies in second transition relation at state K+1. Such an asserted equivalence may be used to simplify first K transition relations by rewiring those transition relations. Thus, the induction engine maintains the assertion that the equivalences hold and modifies all logic that is fed by these equivalent signals.

After the speculative reduction is performed, the induction engine identifies structural dependencies for multiple sets of signals of the proof graph (step 1608). That is, a cone-of-influence (COI) is a set of all logic gates that either directly or indirectly affect the value of a signal. When equivalence is tested in a K+1 transition relation, the COI of the equivalent signals includes logic that has been modified by the induction engine. If the speculatively reduced equivalences are incorrect, then the test of the equivalence in the K+1 transition relation is inconclusive. Such an identification of an inconclusive result implies that the tested equivalence has a dependency on the equivalences which simplified its COI. Thus, induction engine identifies that one set of equivalencies is dependent on another set of equivalencies and records each structural dependency as an edge in the proof graph (step 1610).

In order to test for proof dependencies, the induction engine determines, for each equivalence or class of equivalences, whether equivalence holds and also identifies which constraints are relevant or affecting and which constraints are non-affecting (step 1612). In the illustrative embodiments, the induction engine utilizes a SAT solver and the set of all asserted equivalences as constraints and, through the use of a lazy constraint algorithm, the SAT solver identifies which assertions or constraints are relevant. If an assertion is relevant or affecting, the SAT solver identifies that the proof depends on the underlying equivalence that was asserted. If the asserted equivalence is not relevant or non-affecting, then the SAT solver identifies that the proof is unsound. In this way, the equivalence being tested is dependent on the asserted equivalence.

If at step 1612 an assertion is relevant or affecting, the induction engine records each proof dependency identified by the SAT solver as another edge in the proof graph (step 1614). Additionally, if at step 1612 the SAT solver identifies an asserted equivalence as not relevant or non-affecting, then the induction engine removes either the asserted equivalence from the set of equivalences or the asserted equivalence class from the set of equivalence classes (step 1616). Thus, the equivalence or the equivalence class will not be considered in any future K-induction iterations.

The induction engine then determines whether all of the equivalences have been tested (step 1618). If at step 1618 all of the equivalences have not been tested, then the operation returns to step 1612. If at step 1618 all of the equivalences have been tested, for each node in the proof graph, the induction engine tests whether each node has a falsified dependency (step 1620). In general, a node has a falsified dependency if there is any path from the node to another node whose equivalences were falsified when tested with the SAT solver during the inductive step tests. If at step 1620 there is no path to a falsified node, then the induction engine identifies that all of the dependencies are satisfied and that the equivalences represented by the node in the proof graph are sequential equivalences (step 1622). Using the identified sequential equivalences, the induction engine merges and/or simplifies the netlist or consumes the sequential equivalence in some application-defined manner (step 1624). The induction engine then removes the redundant signal from future consideration (step 1626). Then the induction engine determines whether there is another node in the proof graph to verify equivalences for (step 1628). If at step 1628 there is another node in the proof graph to verify equivalences for, then the operation returns to step 1620. If at step 1628 there are no more nodes in the proof graph to verify equivalences for, then the induction engine terminates is verification of netlist. If at step 1620 there is a path to a falsified node, then the operation proceeds to step 1628.

Figure 17A:
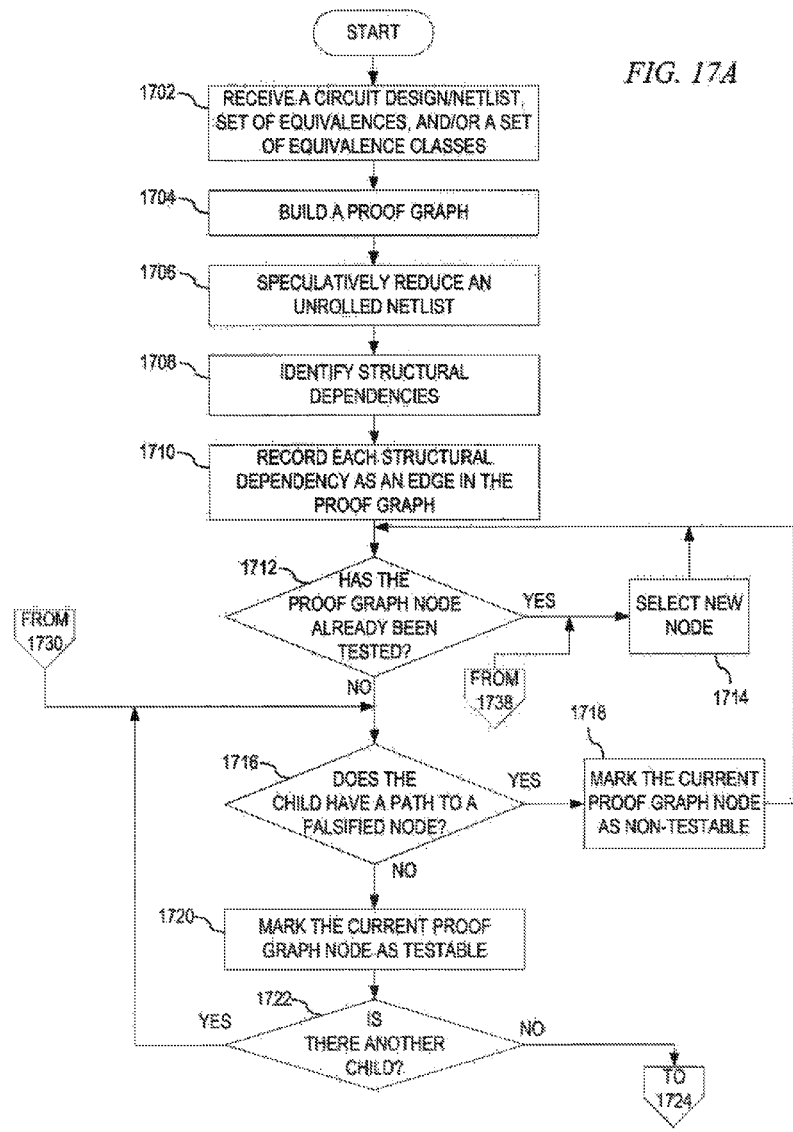
FIGS. 17A and 17B depict a flowchart outlining example operations performed by an induction engine for merging or simplifying a netlist as well as simplify the K-induction loop itself in accordance with an illustrative embodiment.
Figure 17B:
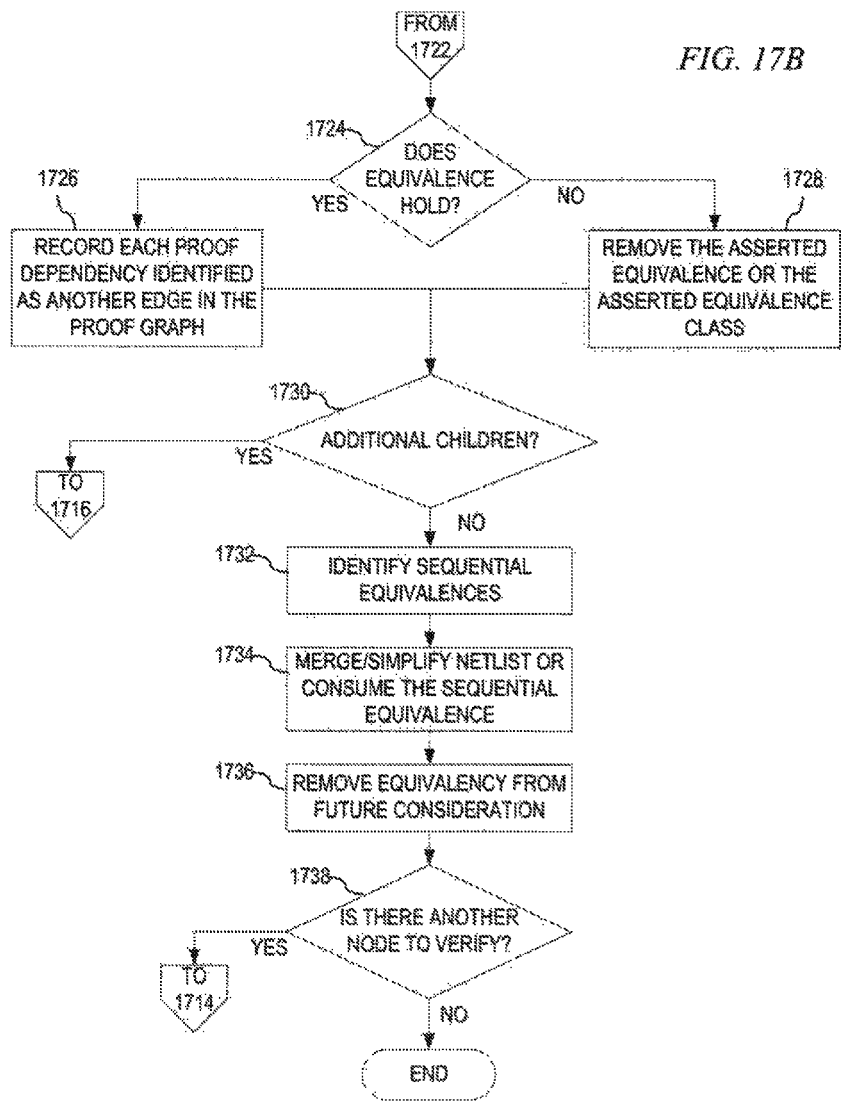

FIGS. 17A and 17B depict a flowchart outlining example operations performed by an induction engine for merging or simplifying a netlist as well as simplify the K-induction loop itself in accordance with an illustrative embodiment. As the operation begins, an induction engine receives input that identifies a circuit design/netlist to be validated as well as a set of equivalences and/or a set of equivalence classes (step 1702). The induction engine then builds a proof graph with one node for each equivalence in the set of equivalences and/or one node for each equivalence class in the set of equivalence classes and without any edges (step 1704). In order to discover structural dependencies of the proof graph, the induction engine speculatively reduces an unrolled netlist (step 1706). In K-induction, an induction engine asserts that suspected equivalences are asserted in a first transition relation at state K and tests the equivalences in second transition relation at state K+1. Such an asserted equivalence may be used to simplify first K transition relations by rewiring those transition relations. Thus, the induction engine maintains the assertion that the equivalences hold and modifies all logic that is fed by these equivalent signals.

After the speculative reduction is performed, the induction engine identifies structural dependencies for multiple sets of signals of the proof graph (step 1708). That is, a cone-of-influence (COI) is a set of all logic gates that either directly or indirectly affect the value of a signal. When equivalence is tested in a K+1 transition relation, the COI of the equivalent signals includes logic that has been modified by the induction engine. If the speculatively reduced equivalences are incorrect, then the test of the equivalence in the K+1 transition relation is inconclusive. Such an identification of an inconclusive result implies that the tested equivalence has a dependency on the equivalences which simplified its COI. Thus, induction engine identifies that one set of equivalencies is dependent on another set of equivalencies and records each structural dependency as an edge in the proof graph (step 1710).

For each node in the proof graph, the induction engine determines whether the current proof graph node has already been tested (step 1712). If at step 1712 the current proof graph node has been tested, then a new proof graph node is selected (step 1714) and the operation returns to step 1712. If at step 1712 the induction engine determines that the current proof graph node has not been tested, then the induction engine loops over all child nodes of the current proof graph node or nodes that have an incident edge coming from the current proof graph node in the proof graph (step 1716). If at step 1716 the induction engine identifies that the child node has a path to a node whose represented equivalence was falsified by the SAT solver, then the induction engine identifies that the child node has a falsified dependency and by extension the current proof graph node has a falsified dependency, determines that early merging at the current proof graph node may not occur, and marks the current proof graph node as non-testable (step 1718) with the operation returning to step 1712 thereafter. Note that, by the induction engine marking the current proof graph node as non-testable, the number of tests that need to be performed is dramatically reduced thereby decreasing the testing time performed by the induction engine.

If at step 1716 the induction engine identifies that the child node fails to have a path to a falsified node, then the induction engine marks the current child as testable (step 1720) and then determines whether there is another child for the current proof graph node to check (step 1722). If at step 1722 there is another child, then the operation returns to step 1716 to check all of the remaining child nodes for the current proof graph. If at step 1722 all child nodes for the current proof graph node have been checked and fail to have a path to a falsified node, then the induction engine tests the equivalences represented by the current proof graph node by utilizing a Boolean satisfiability (SAT) solver that supports lazy constraints and, for each equivalence or class of equivalences, determines whether equivalence holds and also identifies which constraints are relevant or affecting and which constraints are non-affecting (step 1724). In the illustrative embodiments, the induction engine utilizes a SAT solver and the set of all asserted equivalences as constraints and, through the use of a lazy constraint algorithm, the SAT solver identifies which assertions or constraints are relevant. If an assertion is relevant or affecting, the SAT solver identifies that the proof depends on the underlying equivalence that was asserted. If the asserted equivalence is not relevant or non-affecting, then the SAT solver identifies that the proof is unsound. In this way, the equivalence being tested is dependent on the asserted equivalence.

If at step 1724 an assertion is relevant or affecting, the induction engine records each proof dependency identified by the SAT solver as another edge in the proof graph (step 1726). Additionally, if at step 1724 the SAT solver identifies an asserted equivalence as not relevant or non-affecting, then the induction engine removes either the asserted equivalence from the set of equivalences or the asserted equivalence class from the set of equivalence classes (step 1728). Thus, the equivalence or the equivalence class will not be considered in any future K-induction iterations.

From steps 1726 and 1728, the induction engine determines whether the SAT solver identified additional children as a result of these proof dependencies (step 1730). If at step 1730 the SAT solver identified additional children, then the operation returns to step 1716 in order for the induction engine to re-verify that all child nodes fails to have a path to a falsified node. If at step 1730 the SAT solver fails to identify new children and the equivalences at the current proof graph node passes, then the induction engine identifies the equivalences of the current proof graph nodes as soundly proven and sequential equivalences (step 1732). Using the identified sequential equivalences, the induction engine merges and/or simplifies the netlist or consumes the sequential equivalence in some application-defined manner (step 1734). The induction engine then removes the redundant signal from future consideration (step 1736). Then the induction engine determines whether there is another node in the proof graph to verify equivalences for (step 1738). If at step 1738 there is another node in the proof graph to verify equivalences for, then the operation returns to step 1714. If at step 1738 there are no more nodes in the proof graph to verify equivalences for, then the induction engine terminates verification of the netlist.

Figure 18:
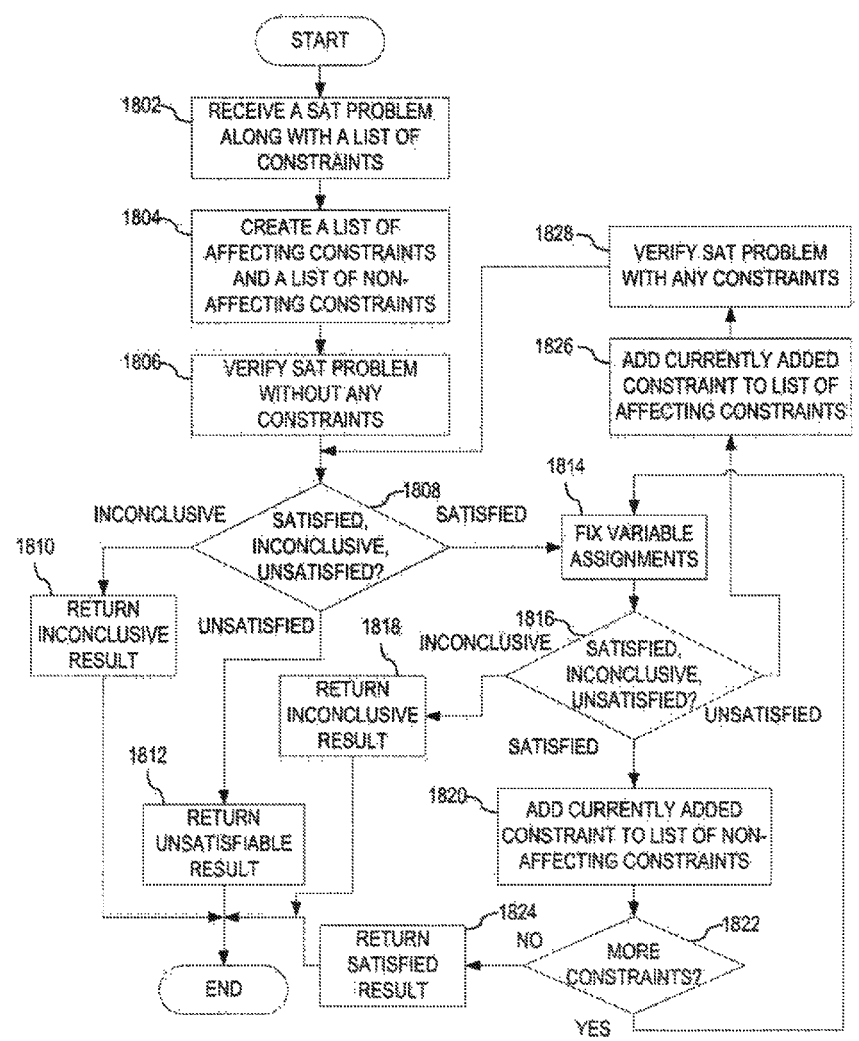
FIG. 18 depicts a flowchart outlining example operations performed by an SAT solver for efficiently determining Boolean satisfiability using "lazy constraints" in accordance with an illustrative embodiment.

FIG. 18 depicts a flowchart outlining example operations performed by an SAT solver for efficiently determining Boolean satisfiability using "lazy constraints" in accordance with an illustrative embodiment. The SAT solver uses a satisfy_lazy(cnf,constraints) algorithm to solve SAT problem(s) in either a conjunctive normal form (cnf) or circuit form along with a list of constraints and returns results of the execution, which may be either satisfiable, unsatisfiable, or inconclusive. With reference to the previous description, the SAT problem may be a node. As the operation begins, the satisfy_lazy(cnf,constraints) algorithm receives a SAT problem along with a list of constraints (step 1802). The satisfy_lazy(cnf,constraints) algorithm creates a list of affecting constraints to track which constraints directly affect the SAT problem as well as a list of non-affecting constraints to track which constraints do not directly affect the SAT problem (step 1804). Initially, the satisfy_lazy(cnf,constraints) algorithm verifies whether the SAT problem may be satisfied without any constraints in the list of constraints being applied (step 1806). The satisfy_lazy(cnf,constraints) algorithm determines whether the verification of the SAT problem may be satisfied without any constraints in the list of constraints results in a satisfiable, unsatisfiable, or inconclusive result (step 1808).

If at step 1808 the satisfy_lazy(cnf,constraints) algorithm determines that the SAT problem without any constraints is inconclusive, then adding additional constraints will not make the SAT problem conclusive, and the satisfy_lazy(cnf,constraints) algorithm returns an inconclusive result to the SAT solver (step 1810), with the operation ending thereafter. If at step 1808 the satisfy_lazy(cnf,constraints) algorithm determines that the SAT problem without any constraints is unsatisfiable, i.e. no variable assignments could be determined to satisfy the SAT problem, then adding additional constraints to the SAT problem will not affect this unsatisfiability, and the satisfy_lazy(cnf,constraints) algorithm returns an unsatisfiable result to the SAT solver (step 1812), with the operation ending thereafter.

If at step 1808 the satisfy_lazy(cnf,constraints) algorithm determines that the SAT problem without any constraints is satisfiable, then the satisfy_lazy(cnf,constraints) algorithm begins a loop over all constraints in the list of constraints by first fixing the variable assignments that were determined in satisfying the SAT problem without any constraints (step 1814). Using a satisfy_another(constraint) portion of the satisfy_lazy(cnf,constraints) algorithm, the satisfy_lazy(cnf,constraints) algorithm uses a first constraint from the list of constraints to determine whether the SAT problem results in the variable assignments that were determined in satisfying the SAT problem without any constraints stays (satisfied), changes (unsatisfied), or is inconclusive (timeout) (step 1816).

If at step 1816 the addition of a constraint from the list of constraints to the SAT problem results in a result of inconclusive, then adding additional constraints will not make the SAT problem with constraints conclusive, and the satisfy_lazy(cnf,constraints) algorithm returns an inconclusive result to the SAT solver (step 1818), with the operation ending thereafter. If at step 1816 the addition of a constraint from the list of constraints to the SAT problem results in a result of satisfied, then the satisfy_lazy(cnf,constraints) algorithm adds the currently added constraint to the list of non-affecting constraints (step 1820). While the addition of the constraint resulted in the result of satisfied with the variable assignments being fixed, other variables may be determined that are required to satisfy the SAT problem with the constraint. That is, the addition of the constraint may require other inputs that were not required by the original the SAT problem and thus were not fixed. The determination of such variable assignments does not result in an unsatisfiable, rather just a new variable assignment that needs to be fixed upon the addition of a new constraint. The satisfy_lazy(cnf,constraints) algorithm then determines whether there is another constraint from the list of constraints (step 1822). If at step 1822 there is another constraint in the list of constraints, then the operation returns to step 1814. If at step 1822 there is another constraint in the list of constraints, the satisfy_lazy(cnf,constraints) algorithm returns an satisfied result to the SAT solver (step 1824), with the operation ending thereafter.

If at step 1816 the addition of a constraint from the list of constraints to the SAT problem results in a result of unsatisfied, then the satisfy_lazy(cnf,constraints) algorithm determines that the existing fixed variable assignments are inconsistent with this new constraint and adds the currently added constraint to the list of affecting constraints (step 1826). The satisfy_lazy(cnf,constraints) algorithm then proceeds to verify whether the SAT problem may be satisfied, but this time with the previously added constraints and the current constraint from the list of constraints (step 1828), with the operation proceeding to step 1808 thereafter.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for simplifying a netlist before computational resources are exceeded. The illustrative embodiments provide a mechanism that uses a framework to track dependencies between equivalences. By using the framework to track dependencies between equivalences, the illustrative embodiments determine which equivalences will hold in all reachable states before a fixed-point is reached. These equivalences may then be merged immediately and this simplification is valid even if K-induction is stopped early due to computational resource limits.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a non-transitory computer readable storage medium having a computer readable program stored therein, wherein the computer readable program, when executed on a computing device, causes the computing device to:
   receive input that identifies a netlist to be validated and at least one of a set of equivalences or a set of equivalence classes;
   build a proof graph without any edges and with at least two of a node for each equivalence in a set of equivalences or at least two of a node for each equivalence class in a set of equivalence classes;
   perform speculative reduction on an unrolled version of the netlist, wherein the speculative reduction asserts a set of suspected equivalences in the set of equivalences or in the set of equivalence classes;
   for each of the set of suspected equivalences in the proof graph of the netlist:
      determine whether equivalence holds for at least one of the equivalence or the equivalence class by identifying whether the equivalence or equivalence class is either affecting of a second equivalence or a second equivalence class or non-affecting of the second equivalence or the second equivalence class; and
      responsive to the equivalence or equivalence class being affecting of the second equivalence or the second equivalence class, record a proof dependency as an edge in the proof graph; and
   for each node in the proof graph:
      determine whether the node has a falsified dependency;
      responsive to the node failing to have a falsified dependency, identify that all dependencies are satisfied and that the equivalences represented by the node in the proof graph are sequential equivalences; and
      simplify the netlist by consuming the sequential equivalences.

2. The computer program product of claim 1, wherein the computer readable program further causes the computing device to:
   responsive to the equivalence or the equivalence class being non-affecting of the second equivalence or the second equivalence class, remove the equivalence from the set of equivalences or the equivalence class from the set of equivalence classes.

3. The computer program product of claim 2, wherein by removing the equivalence from the set of equivalences or the equivalence class from the set of equivalence classes removes the equivalence or equivalence class from future consideration during processing of the netlist.

4. The computer program product of claim 1, wherein the computer readable program to simplify the netlist by consuming the sequential equivalences further causes the computing device to:
   remove a redundant equivalence or a redundant equivalence class from future consideration during processing of the netlist.

5. The computer program product of claim 1, wherein the computer readable program further causes the computing device to:
   determine whether the node in the proof graph has already been tested;
   responsive to the node failing to have been previously tested, for each other node in a set of other nodes that has an incident edge coming from the node, determine whether the other node has a path to a falsified node; and
   responsive to the other node having a path to a falsified node, mark the other node as non-testable, wherein marking the other node as non-testable reduces the number of tests that need to be performed and decreases testing time.

6. An apparatus, comprising:
a processor; and
a memory coupled to the processor, wherein the memory comprises instructions which, when executed by the processor, cause the processor to:

receive input that identifies a netlist to be validated and at least one of a set of equivalences or a set of equivalence classes;

build a proof graph without any edges and with at least two of a node for each equivalence in a set of equivalences or at least two of a node for each equivalence class in a set of equivalence classes;

perform speculative reduction on an unrolled version of the netlist, wherein the speculative reduction asserts a set of suspected equivalences in the set of equivalences or in the set of equivalence classes;

for each of the set of suspected equivalences in the proof graph of the netlist:
  determine whether equivalence holds for at least one of the equivalence or the equivalence class by identifying whether the equivalence or equivalence class is either affecting of a second equivalence or a second equivalence class or non-affecting of the second equivalence or the second equivalence class; and
  responsive to the equivalence or equivalence class being affecting of the second equivalence or the second equivalence class, record a proof dependency as an edge in the proof graph; and for each node in the proof graph:
  determine whether the node has a falsified dependency;
  responsive to the node failing to have a falsified dependency, identify that all dependencies are satisfied and that the equivalences represented by the node in the proof graph are sequential equivalences; and
  simplify the netlist by consuming the sequential equivalences.

7. The apparatus of claim 6, wherein the instructions further cause the processor to:
  responsive to the equivalence or the equivalence class being non-affecting of the second equivalence or the second equivalence class, remove the equivalence from the set of equivalences or the equivalence class from the set of equivalence classes.

8. The apparatus of claim 7, wherein by removing the equivalence from the set of equivalences or the equivalence class from the set of equivalence classes removes the equivalence or equivalence class from future consideration during processing of the netlist.

9. The apparatus of claim 6, wherein the instructions to simplify the netlist by consuming the sequential equivalences further cause the processor to:
  remove a redundant equivalence or a redundant equivalence class from future consideration during processing of the netlist.

10. The apparatus of claim 6, wherein the instructions further cause the processor to:
  determine whether the node in the proof graph has already been tested;
  responsive to the node failing to have been previously tested, for each other node in a set of other nodes that has an incident edge coming from the node, determine whether the other node has a path to a falsified node; and
  responsive to the other node having a path to a falsified node, mark the other node as non-testable, wherein marking the other node as non-testable reduces the number of tests that need to be performed and decreases testing time.

* * * * *